(12) United States Patent  
Derbeko et al.

(10) Patent No.: US 9,177,670 B1  
(45) Date of Patent: Nov. 3, 2015

(54) METHOD AND APPARATUS FOR FLASH CACHE MANAGEMENT

(71) Applicant: EMC Corporation, Hopkinton, MA (US)

(72) Inventors: Philip Derbeko, Modiin (IL); Zvi Gabriel Benhanokh, Tel Aviv (IL); Assaf Natanzon, Tel Aviv (IL); Arieh Don, Newton, MA (US); Anat Eyal, Tel Aviv (IL); Alexandr Veprinsky, Brookline, MA (US)

(73) Assignee: EMC Corporation, Hopkinton, MA (US)

( * ) Notice: Subject to any disclaimer, the term of this patent is extended or adjusted under 35 U.S.C. 154(b) by 211 days.

(21) Appl. No.: 14/041,290

(22) Filed: Sep. 30, 2013

(51) Int. Cl.  
*G11C 29/00* (2006.01)  
*G06F 11/00* (2006.01)  
*G11C 29/08* (2006.01)  
*G06F 11/07* (2006.01)

(52) U.S. Cl.  
CPC ............ *G11C 29/08* (2013.01); *G06F 11/0706* (2013.01)

(58) Field of Classification Search  
CPC .... G06F 11/076; G06F 11/0706; G11C 29/08  
USPC ........... 714/704, 718, 745, 773, 6.32, 6.1, 42; 365/201, 200, 204, 218, 189.2, 189.09; 711/113, 111, 100  
See application file for complete search history.

(56) References Cited

U.S. PATENT DOCUMENTS

| | | | |
|---|---|---|---|
| 8,595,593 B2 * | 11/2013 | Joo | 714/766 |
| 8,599,617 B2 * | 12/2013 | Shiino et al. | 365/185.17 |
| 8,929,170 B2 * | 1/2015 | Park et al. | 365/227 |
| 2013/0173972 A1 * | 7/2013 | Kubo | 714/718 |

* cited by examiner

*Primary Examiner* — Christine Tu  
(74) *Attorney, Agent, or Firm* — Krishnendu Gupta; Gerald P. Kazanjian (57) ABSTRACT

Example embodiments of the present invention relate to a method and a system for improving performance of flash cache memory, such as in a host of a storage environment, for example, by preventing a cache cell from reaching an operation limit. The method includes determining that a number of operations to a first cell of a flash memory has reached a threshold and managing the flash memory according to the determination to prevent a failure of a second cell of the flash memory.

20 Claims, 7 Drawing Sheets

METHOD AND APPARATUS FOR FLASH CACHE MANAGEMENT

A portion of the disclosure of this patent document may contain command formats and other computer language listings, all of which are subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

This application relates to caching using flash memory.

BACKGROUND

Flash memory is valued in many applications as a storage medium due to its fast access speeds, low-power, nonvolatility, and rugged operation. The flash translation layer (FTL) is the driver that works in conjunction with an existing operating system (or, in some embedded applications, as the operating system) to make linear flash memory appear to the system like a disk drive. It does that be doing a number of things. First, it creates "virtual" small blocks of data, or sectors, out of flash's large erase blocks. Next, it manages data on the flash so that it appears to be "write in place" when in fact it is being stored in different spots in the flash. Finally, FTL manages the flash so there are clean/erased places to store data.

SUMMARY

Example embodiments of the present invention relate to a method and a system for improving performance of flash cache memory, such as in a host of a storage environment, for example, by preventing a cache cell from reaching an operation limit. The method includes determining that a number of operations to a first cell of a flash memory has reached a threshold and managing the flash memory according to the determination to prevent a failure of a second cell of the flash memory.

BRIEF DESCRIPTION OF THE DRAWINGS

The above and further advantages of the present invention may be better under stood by referring to the following description taken into conjunction with the accompanying drawings in which.

DETAILED DESCRIPTION

The flash translation layer (FTL) remaps the data to the physical location at which the data is to be written. This allows the file system to treat flash like any other block storage device and remain ignorant of flash device characteristics. FTL appears to simply take the data from the file system and write it at the specified location (sector). In reality, however, FTL places the data at a free/erased location on the flash media and notes the real location of the data. It also invalidates the cell that previously contained the cell's data (if any). So when the file system asks for the data that was written out, FTL finds and reads back the proper data.

However, flash storage has a number of inherent limitations. Such limitations include is the read-disturb and write-disturb effects, in which the respective methods used to read from and write to flash memory can cause nearby cells in the same memory block to change over time (i.e., become programmed unintentionally). While the threshold number of read/write operations generally may be in the hundreds of thousands between intervening erase operations, if performing continuous operations on one cell, that cell will not fail but rather one of the surrounding cells will fail on a subsequent operation.

Traditional solutions to flash limitations, many of which are handled by FTL, come with a significant performance penalty. For example, to avoid the read-disturb effect, the flash controller typically will count the total number of reads to a cell since the last erase of that cell (or the block containing that cell if the flash memory is limited to block erasure). When the count exceeds a target limit, the affected cell/block is copied over to a new block, erased, and then released to the block pool, thereby leaving the original block as good as new after the erase.

However, such traditional solutions impart a performance penalty by requiring the flash controller find a place in the flash memory to move the data based on the block size (i.e., the flash controller must move not only the data for the affected cell but also all cells on its block). Example embodiments of the present invention overcome these and other deficiencies by providing a method and an apparatus that improve performance of flash cache memory, such as in a host of a storage environment, for example, by preventing a cache cell from reaching a read-disturb limit.

Figure 1:
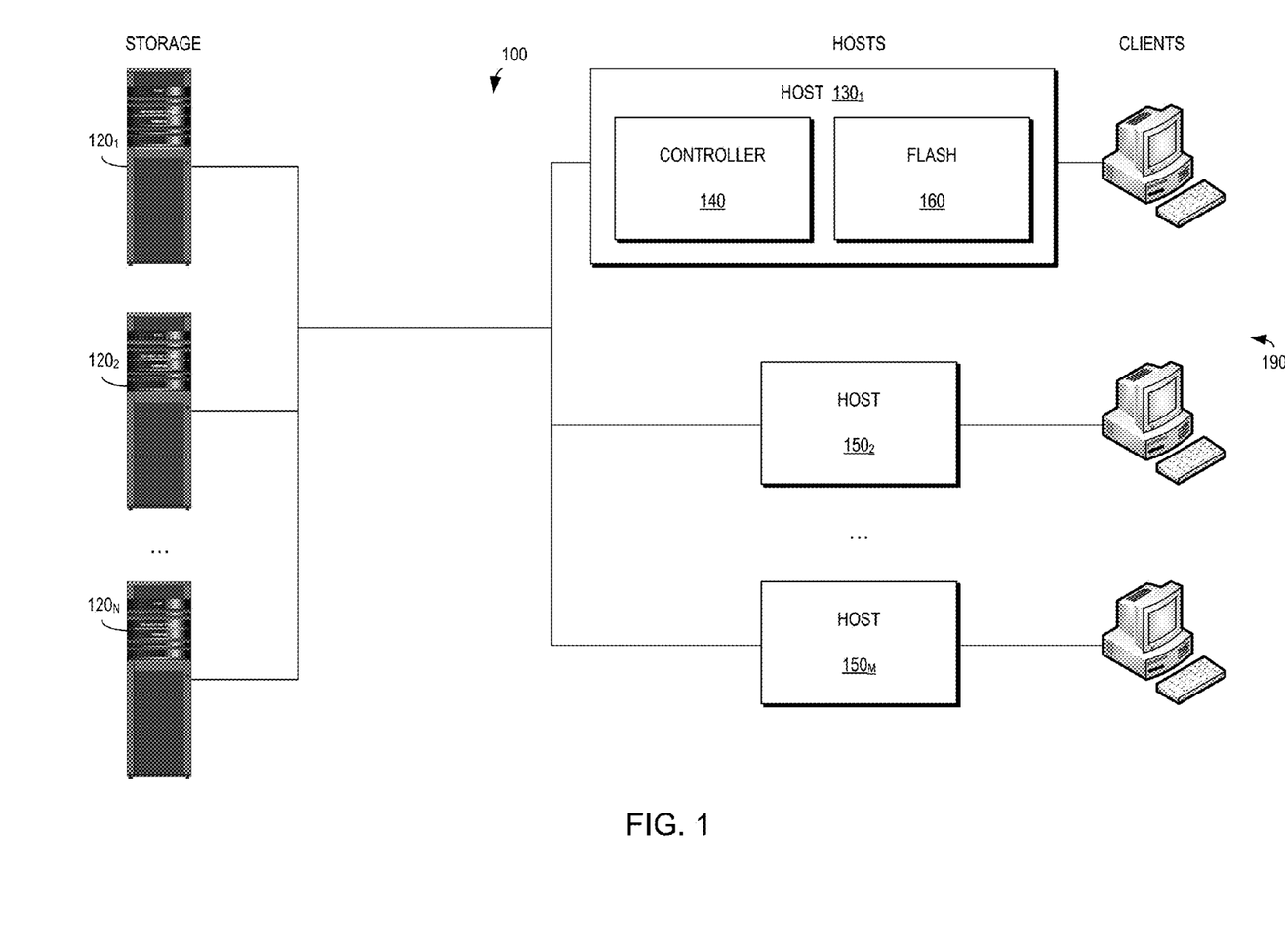
FIG. 1 is a block diagram of a storage area network (SAN) according to an example embodiment of the present invention.

FIG. 1 is a block diagram of a storage area network (SAN) 100 according to an example embodiment of the present invention. As illustrated in FIG. 1, the SAN 100 may include a plurality of storage arrays $120_1$-$120_N$ (120 generally) and a plurality of storage resource management hosts $130_1$-$130_m$ (130 generally) that may host applications for clients 190 using the storage 120. In certain embodiments, respective hosts 130 may include flash memory 160 for storing data and a controller 140 for managing the flash memory 160. In a preferred embodiment, the flash memory 160 in the host 130 is flash cache memory 160 and the controller 140 manages the flash cache memory 160.

Figure 2A:
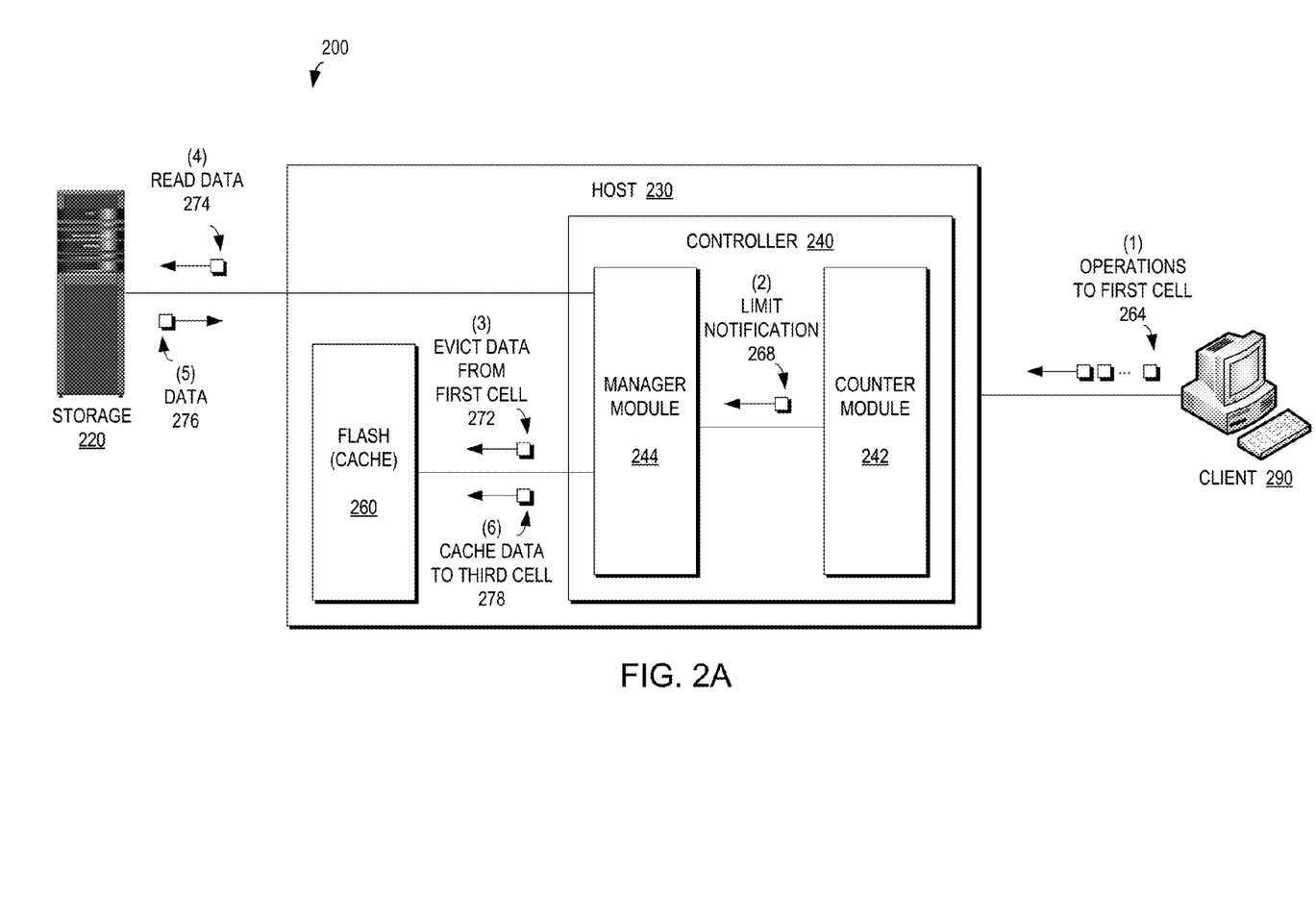
FIGS. 2A and 2B are block diagrams of a host flash controller according to example embodiments of the present invention.
Figure 2B:
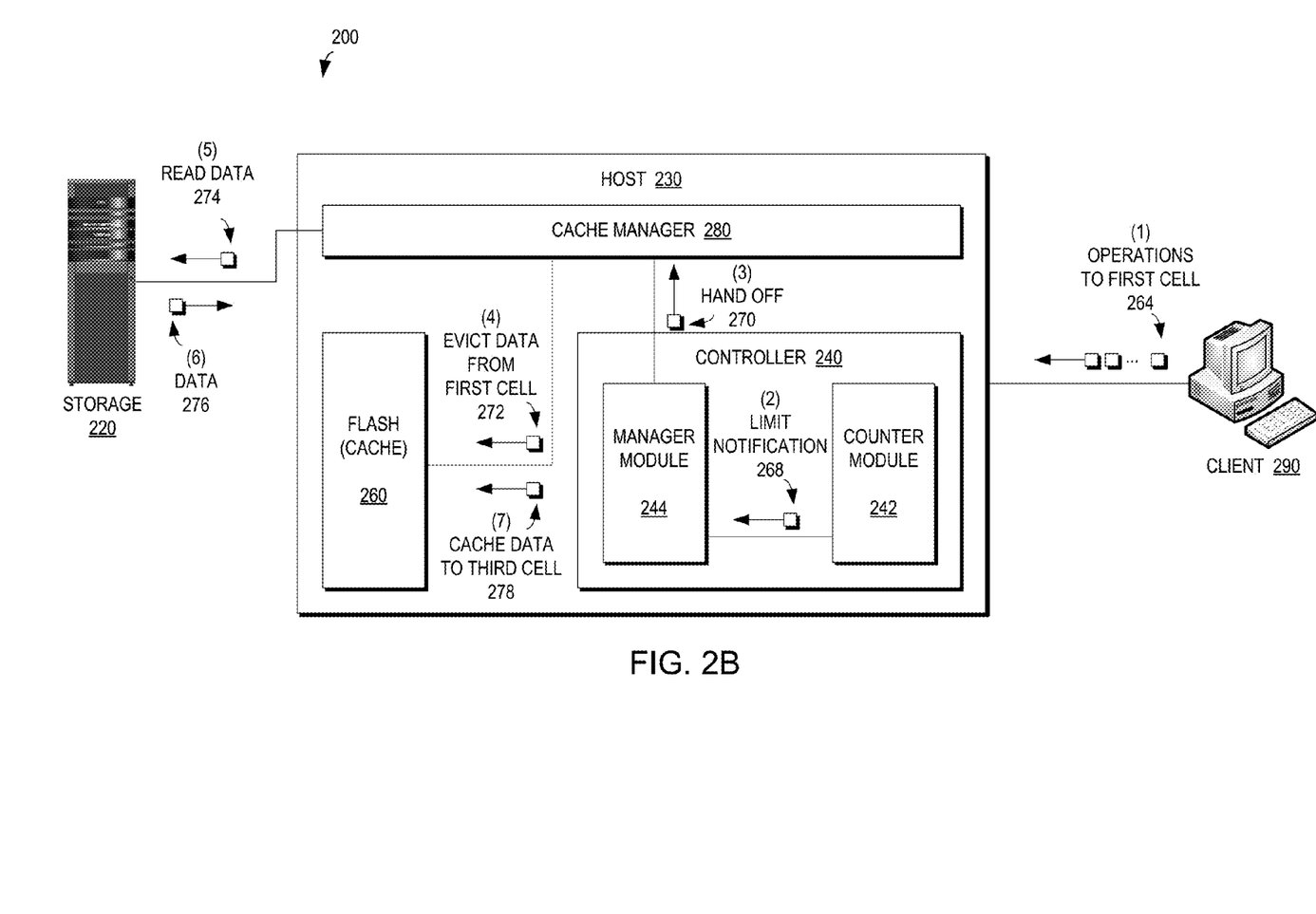

FIGS. 2A and 2B are block diagrams of a portion of the SAN of FIG. 1 including a host 230 and storage 220 according to example embodiments of the present invention. Similar to FIG. 1, the host 230 may include a controller 240 and flash cache memory 260. The host flash controller 240 may include a counter module 242 and a manager module 244. As will be described in greater detail below, the counter module 242 may be configured to keep track of the number of operations to respective cells of the flash cache memory 260 and the manager module 244 may be configured to manage the flash cache memory 260 according to the determination by the counter module 242 of the number of operations to respective cells of the flash cache memory 260.

Figure 4:
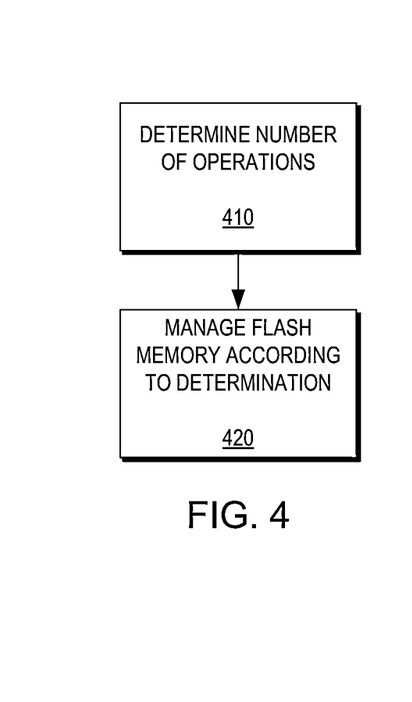
FIGS. 4-6 are flow diagrams illustrating methods accordingly to example embodiments of the present invention.
Figure 5:
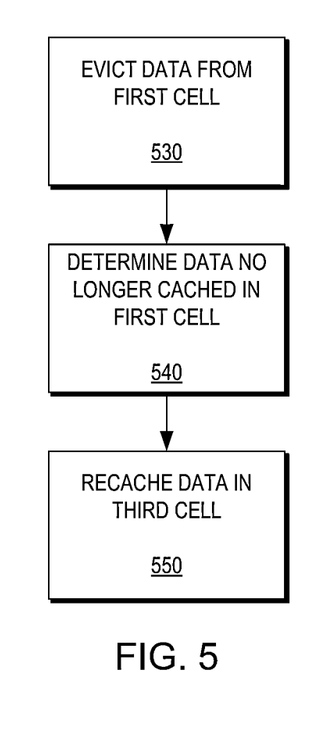
Figure 6:
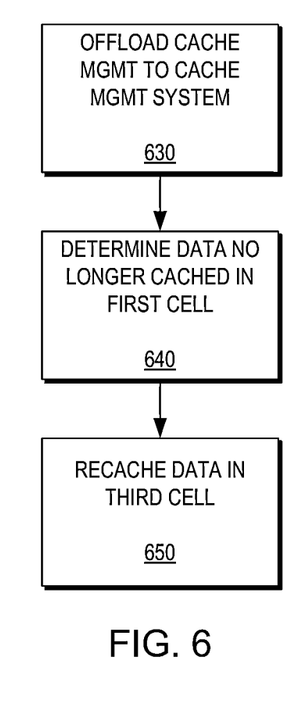

FIGS. 2A and 2B are described below in conjunction with FIGS. 3A-3D and 4-6. FIGS. 3A-3D are block diagrams illustrating respective states of an array 360 of flash cells $362_0$-$362_N$ (362 generally) according to example embodiments of the present invention. FIGS. 4-6 are flow diagrams illustrating methods accordingly to example embodiments of the present invention.

As illustrated in FIGS. 2A, 2B, 3A, 3B, and 4, (1) a client 290 may send a plurality of operations 264 to the host 230 which may be received 364 by a particular cell (a first cell) $362_1$. As understood in the art, such repeated operations 364 to the first cell $362_1$ can cause a disturb effect 366 (e.g., read-disturb or write-disturb depending on the operation type) on its adjacent cells (e.g., cells $362_0$ and $362_2$). The counter module 242 may keep track of the number of operations 364 to the first cell $362_1$ and determine whether the number of operations 364 to the first cell 362 has reached a threshold (410). It should be understood that the counter module 242 may keep track of the number of read operations or the number of write operations, or a combination of the number of read operations and the number of write operations.

The manager module 244 then may manage the flash memory 260/360 according to the determination by the counter module 242 to prevent a disturb failure of a second cell of the flash memory 260/360 (i.e., one of the adjacent cells $362_0$ and $362_2$) (420). At a time when the counter module 242 reaches a pre-defined value where a disturb effect's risk becomes high but is still below the threshold at which the disturb effect would affect the adjacent cells $362_0$ and $362_2$, (2) the counter module 242 may send a limit notification 268 to the manager module 244.

Figure 3A:
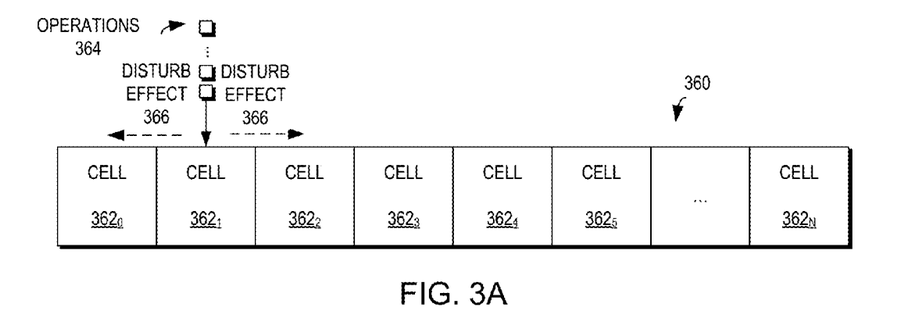
FIGS. 3A-3D are block diagrams illustrating respective states of an array of flash cells according to example embodiments of the present invention.
Figure 3B:
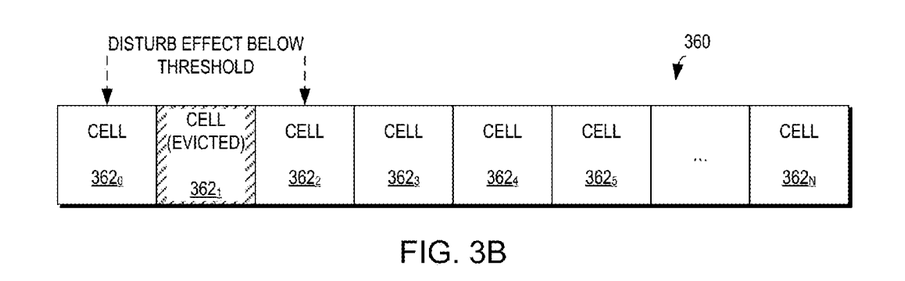
Figure 3C:
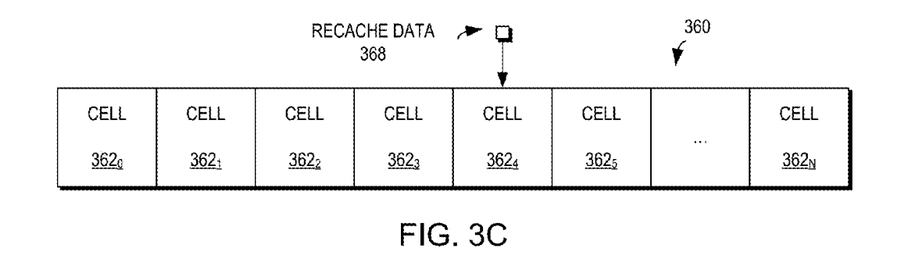

As illustrated in FIGS. 2A, 3C, and 5, (3) the manager module 244 may evict 272 the data from the first cell $362_1$ (530). In other words, the manager module 244 may remove the entry from the caching layer as well as erase it from the flash device. Accordingly, example embodiments of the present invention take advantage of the fact that data stored on the flash cache memory 260/360 is a copy of the data stored on the storage 220 in the storage area network 200 (i.e., it is not being used as primary storage but rather is caching data from the storage 220 in the storage area network 200) and may be erased from the flash cache memory 260/360 without causing data loss at the storage 220.

It should be understood that, at a later time, the host 230 may receive a read operation for the data evicted from the first cell $362_1$ and the controller 240 may determine that the data previously cached in the first cell $362_1$ is no longer cached at the first cell $362_1$ (540). As illustrated in FIG. 3C, the manager module 244 may cause the data to be recached in a third cell $362_4$ of the flash cache memory 260/360, such as by (4) reading 274 the data from the storage 220 storing the data previously cached in the first cell $362_1$, (5) receiving the data 276 from the storage 220, and (6) caching the data 278 read from the storage 220 in the third cell $362_4$ (550).

As illustrated in FIGS. 2B, 3C, and 6, in certain embodiments, the host 230 also may include a cache manager 280 to manage the flash cache memory 260. For example, the cache manager 280 may provide cache management operations, such as those provided by XtremSW™ from EMC Corporation of Hopkinton, Mass. Accordingly, in this example embodiment, (3) the manager module 244 may offload cache management to the cache manager 280 (630), such as by performing a registration operation with the cache manager 280 and notifying the cache manager of the determination of the reached threshold. Therefore, the cache manager 280 may (4) evict the data from the first cell $362_1$.

It should be understood that, similar to the operation of the manager module 244, at a later time, the host 230 may receive a read operation for the data evicted from the first cell $362_1$ and the cache manager 280 may determine that the data previously cached in the first cell $362_1$ is no longer cached at the first cell $362_1$ (640). As illustrated in FIG. 3C, the cache manager 280 may cause the data to be recached in a third cell $362_4$ of the flash cache memory 260/360, such as by (5) reading 274 the data from the storage 220 storing the data previously cached in the first cell $362_1$, (6) receiving the data 276 from the storage 220, and (7) caching the data 278 read from the storage 220 in the third cell $362_4$ (650).

Figure 3D:
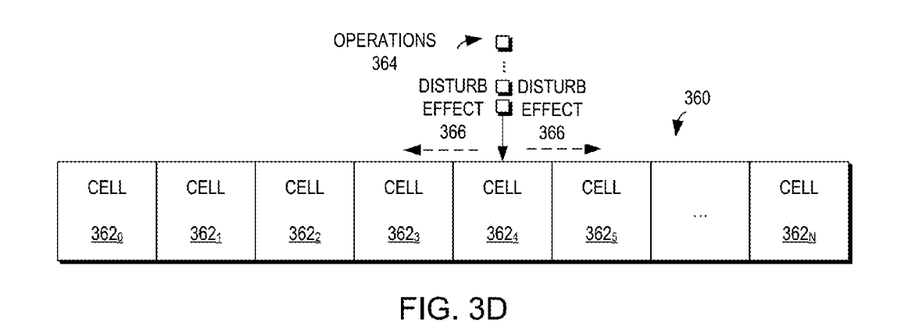

Accordingly, as illustrated in FIG. 3D, any subsequent operations 364 for the data will be directed to the third cell $362_4$ rather than the first cell $362_1$ and the disturb effect threshold for the cells adjacent to the cell previously stored in the data $362_1$ will be avoided because the data was recached to the third cell $362_4$. Therefore, it should be understood that, as subsequent operations arrive, the counter module 242 treats the third cell $362_4$ as it previously treated the first cell $362_1$ and counts the number of operations performed on the third cell $362_4$ because the disturb effect 366 now will be experienced by the cells adjacent to the third cell $362_4$ (e.g., cells $362_3$ and $362_5$) rather than the cells adjacent to the first cell $362_1$ (e.g., cells $362_0$ and $362_2$). Further, it should be understood that, at a later time, the cache page (not shown) storing the first cell $362_1$ for which the data was evicted will be erased and re-written anew.

Figure 7:
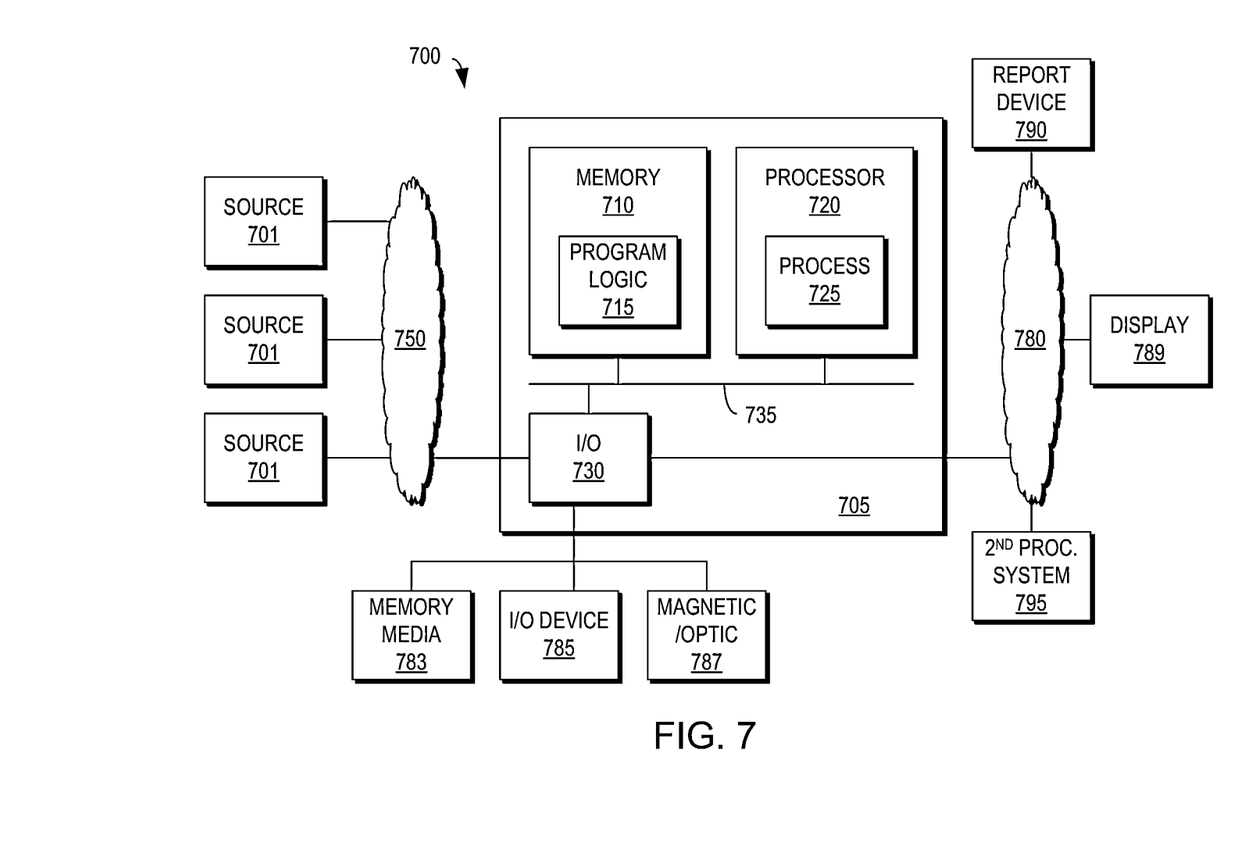
FIG. 7 is a block diagram of an apparatus according to an example embodiment of the present invention.

FIG. 7 is a block diagram of an example embodiment apparatus 705 according to the present invention. The apparatus 705 may be part of a system 700 and includes memory 710 storing program logic 715, a processor 720 for executing a process 725, and a communications I/O interface 730, connected via a bus 735.

The methods and apparatus of this invention may take the form, at least partially, of program code (i.e., instructions) embodied in tangible non-transitory media, such as floppy diskettes, CD-ROMs, hard drives, random access or read only-memory, or any other machine-readable storage medium. When the program code is loaded into and executed by a machine, such as the computer of FIG. 7, the machine becomes an apparatus for practicing the invention. When implemented on one or more general-purpose processors, the program code combines with such a processor to provide a unique apparatus that operates analogously to specific logic circuits. As such, a general purpose digital machine can be transformed into a special purpose digital machine.

Figure 8:
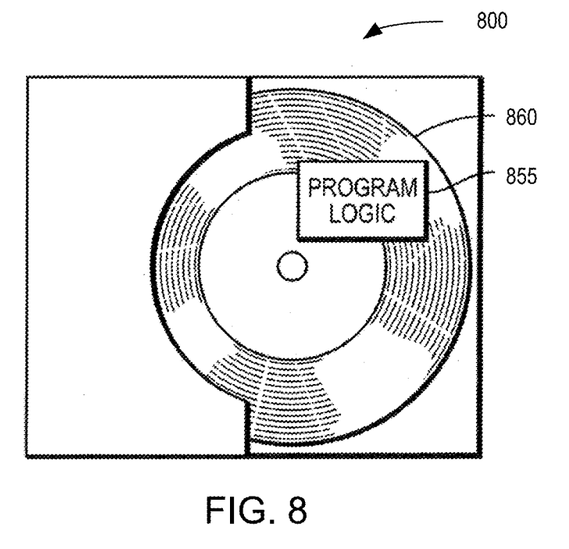
FIG. 8 is an illustration of an example embodiment of the present invention embodied as a computer program product.

FIG. 8 shows program logic 855 embodied on a computer-readable medium 860 as shown, and wherein the logic 855 is encoded in computer-executable code configured for carrying out the methods of this invention, thereby forming a computer program product 800.

The logic for carrying out the method may be embodied as part of the aforementioned system, which is useful for carrying out a method described with reference to embodiments shown. For purposes of illustrating the present invention, the invention is described as embodied in a specific configuration and using special logical arrangements, but one skilled in the art will appreciate that the device is not limited to the specific configuration but rather only by the claims included with this specification.

Although the foregoing invention has been described in some detail for purposes of clarity of understanding, it will be apparent that certain changes and modifications may be practiced within the scope of the appended claims. Accordingly, the present implementations are to be considered as illustrative and not restrictive, and the invention is not to be limited to the details given herein, but may be modified within the scope and equivalents of the appended claims.

What is claimed is:

1. A method comprising:
   determining that a number of operations to a first cell of a flash memory has reached a threshold; and
   managing the flash memory according to the determination to prevent a failure of a second cell of the flash memory.

2. The method of claim 1 wherein the flash memory is flash cache memory.

3. The method of claim 1 wherein the threshold is below the threshold of operations to the first cell that would cause the failure of the second cell.

4. The method of claim 1 wherein managing the flash memory according to the determination to prevent a failure of a second cell of the flash memory comprises evicting data stored in the first cell from the flash memory.

5. The method of claim 4 further comprising:
   determining that the data previously cached in the first cell is no longer cached at the first cell; and
   recaching the data previously cached in the first cell in a third cell of the flash cache memory.

6. The method of claim 5 wherein recaching the data previously cached in the first cell in a third cell of the flash cache memory comprises:
   reading the data from a storage device storing the data previously cached in the first cell; and
   caching the data read from the storage device in the third cell.

7. The method of claim 6 further comprising:
   erasing a page of the flash cache memory including the first cell; and
   caching new data to the first cell.

8. The method of claim 4 wherein managing the flash memory according to the determination to prevent a failure of a second cell of the flash memory further comprises offloading cache management to a cache management system.

9. The method of claim 8 further comprising:
   determining, by the cache management system, that the data previously cached in the first cell is no longer cached at the first cell; and
   recaching, by the cache management system, the data previously cached in the first cell in a third cell of the flash cache memory.

10. The method of claim 8 wherein offloading cache management to a cache management system comprises:
    performing a registration operation with the cache management system; and
    notifying the cache management system of the determination of the reached threshold.

11. A system comprising:
    flash memory;
    a counter module configured to determine that a number of operations to a first cell of the flash memory has reached a threshold; and
    a manager module configured to manage the flash memory according to the determination to prevent a failure of a second cell of the flash memory.

12. The system of claim 11 wherein the flash memory is flash cache memory.

13. The system of claim 11 wherein the threshold is below the threshold of operations to the first cell that would cause the failure of the second cell.

14. The system of claim 11 wherein the manager module is further configured to evict data stored in the first cell from the flash memory.

15. The system of claim 14 further comprising a cache manager configured to determine that the data previously cached in the first cell is no longer cached at the first cell and recache the data previously cached in the first cell in a third cell of the flash cache memory.

16. The system of claim 15 wherein the cache manager is further configured to read the data from a storage device storing the data previously cached in the first cell and cache the data read from the storage device in the third cell.

17. The system of claim 16 wherein the cache manager is further configured to erase a page of the flash cache memory including the first cell and cache new data to the first cell.

18. The system of claim 15 wherein the manager module is further configured to offload cache management to the cache manager.

19. The system of claim 18 wherein the manager module is further configured to perform a registration operation with the cache manager and notify the cache manager of the determination of the reached threshold.

20. A computer program product including a nontransitory computer readable storage medium storing computer program code comprising:
    computer program code for determining that a number of operations to a first cell of a flash memory has reached a threshold; and
    computer program code for managing the flash memory according to the determination to prevent a failure of a second cell of the flash memory.

* * * * *